(12) United States Patent
Andreadakis

(10) Patent No.: US 10,938,409 B1
(45) Date of Patent: Mar. 2, 2021

(54) COMPRESSION USING ENTROPY REDUCTION BASED ON PSEUDO RANDOM NUMBERS

(71) Applicant: Panagiotis Andreadakis, Alimos (GR)

(72) Inventor: Panagiotis Andreadakis, Alimos (GR)

( * ) Notice: Subject to any disclaimer, the term of this patent is extended or adjusted under 35 U.S.C. 154(b) by 0 days.

(21) Appl. No.: 17/013,583

(22) Filed: Sep. 5, 2020

(51) Int. Cl.
*H03M 7/30* (2006.01)
*G06F 7/58* (2006.01)

(52) U.S. Cl.
CPC ............ *H03M 7/30* (2013.01); *G06F 7/582* (2013.01)

(58) Field of Classification Search
CPC ....... G06F 7/582; G06F 16/1744; H03M 7/30
See application file for complete search history.

(56) References Cited

U.S. PATENT DOCUMENTS

| | | | | |
|---|---|---|---|---|
| 5,486,826 A * | 1/1996 | Remillard | ............... | H03M 7/30 341/51 |
| 6,411,228 B1 * | 6/2002 | Malik | ..................... | H03M 7/34 341/67 |
| 7,003,111 B2 * | 2/2006 | Jaquette | ............... | G06F 21/6209 380/277 |
| 2005/0169465 A1 * | 4/2005 | Itani | ........................ | H04L 9/00 380/42 |
| 2007/0028088 A1 * | 2/2007 | Bayrak | ................. | H04L 9/0662 713/150 |
| 2009/0274294 A1 * | 11/2009 | Itani | ........................ | H03M 7/30 380/28 |
| 2010/0228703 A1 * | 9/2010 | Schneider | ............... | H03M 7/30 707/693 |
| 2015/0086013 A1 * | 3/2015 | Metzler | ................. | H04L 9/0618 380/210 |
| 2020/0092283 A1 * | 3/2020 | Parkinson | ............... | G06F 16/27 |

* cited by examiner

*Primary Examiner* — Andrew Caldwell
*Assistant Examiner* — Carlo Waje
(74) *Attorney, Agent, or Firm* — Franco S. DeLiguori; DP IP Group

(57) ABSTRACT

Techniques for compressing binary input data streams and files by reducing entropy of the input data prior to compression. Entropy reduction is achieved by first getting a stream of single-digit decimal pseudo random numbers and calculating the frequency of occurrence of each decimal number in the even and odd positions of the pseudo random number stream. Subsets of the frequencies of occurrence of the decimal digits are selected to best match the frequency of occurrence of "0" and "1" in the odd and even positions of the binary input data stream. The decimal digits of the subsets of frequencies of occurrence are selectively set to "0" or "1" thereby creating a binary pseudo random number (i.e. mapping) stream, which is XORed with the binary input stream and compressed. Decompression uses the same pseudo random number stream using the mapping stream and the seed number used during compression.

18 Claims, 5 Drawing Sheets

COMPRESSION USING ENTROPY REDUCTION BASED ON PSEUDO RANDOM NUMBERS

BACKGROUND

Field

The present invention relates to data compression based on methodologies for reducing entropy of already compressed data.

Background

Data compression is a process used for encoding information using fewer data (i.e. bits in the case of digital data) than the original representation. Data compression is used to reduce the size of the original data for better use of the available storage resources (e.g. memory or disc space) and transmission media bandwidth (e.g. wired or wireless telecommunication networks). Data compression became particularly important after the use of audio-visual content and very large files became widespread during the last few 20-30 years and especially after the introduction of wireless computing devices which rely on limited storage capabilities and scarce wireless (cellular, etc.) transmission resources.

Decompression is the reverse process to compression, used to recover the original-uncompressed data. The aim of decompression is to produce as good an approximation to the original-uncompressed data.

Any particular compression is either lossy or lossless. Lossless compression reduces data bits by identifying and eliminating statistical redundancy. No information is lost in lossless compression, effectively allowing the decompression of the compressed data into a decompressed data representation that is identical to the original data. Lossy compression reduces data bits by removing unnecessary or less important information. Lossy compression typically achieves greater reductions in the size of the compressed data but at the cost of losing some of the original information.

Lossy compression is widely used in the compression of audiovisual data (e.g. JPEG, MPEG, MP3 compression standards for images, video, and sound, respectively) where some loss in the quality of the original data is acceptable by the owner/consumer of the data or the loss in quality is imperceptible to the human eye or ear.

Lossless compression is a prerequisite when compressing data files and text, where the loss of parts of the original information may render the file unusable or result in obvious errors in the text. Lossy compression in these cases would be catastrophic or require additional correction step to be performed on the decompressed data to correct the errors caused by the missing data. However, these correction steps are time and computationally intensive and do not always result in the recovery of the original data.

Typically, a device that performs data compression is referred to as an encoder, and one that performs the reversal of the process (decompression) as a decoder.

Current compression/decompression processes and devices leave the compressed data vulnerable to malicious acts (e.g. compressed data theft, eavesdropping or interception during transmission of the compressed data, etc.). Since known compression processes and devices are designed only to reduce the size of data and to reconstruct the original data, respectively, their users need to rely to security (e.g. access control) and encryption mechanisms integrated with their computing devices and the data networks they use. However, these security and encryption mechanisms do not provide adequate protection and they are often compromised by malicious act or cybercriminals.

The problem with known compression and decompression processes (and consequently encoder and decoder devices) is that they can achieve a modest amount of compression for perfect decompression (i.e. for lossless compression), or for a desired minimum loss of information (i.e. for lossy compression). Furthermore, some of the compression processes (e.g. JPEG, MPEG, MP3 compression) are designed to operate with certain kinds of data and are not suitable for general purpose data compression or for iterative use on the same data to increase the amount of data compression. Last, current compression/decompression algorithms cannot cater for data security in the event of malicious acts.

There is, therefore, a clear need for compression/decompression processes and apparatuses that can achieve very high data compression, be applicable to any type of data, and offer security to compressed data storage and transmission.

SUMMARY

The present disclosure describes novel techniques for addressing challenges encountered in compression and decompression for achieving higher compression ratios for any type of data, while safeguarding the data against malicious acts.

In a first exemplary embodiment, a binary input stream (or file) is processed to calculate the frequencies of occurrence of the binary bits "0" and "1" at the even and odd positions of the binary input. A pseudo-random number generator is used together with a seed to produce a pseudo random number stream of single-digit decimal pseudo random numbers and the frequency of occurrence of each decimal number (0 . . . 9) at even and odd positions in the pseudo-random number string is calculated. A selection of the frequencies of occurrence for the decimal numbers is made based on the criterion that their sum matches (or best approximates) the frequency of the binary bits for the even and odd positions, respectively. The decimal numbers, corresponding to the selected frequencies of occurrence, are set to "0" or "1", according to which frequency of occurrence for the decimal numbers their sum matches, and thereby a mapping is made between the pseudo random number stream and a new binary stream. The new binary stream is XORed with the input binary stream to produce a new binary stream of reduced entity which is then compressed.

In a second exemplary embodiment, the entropy reduction and compression processes are iteratively applied to increase the compression ratio of the input stream.

In a third exemplary embodiment, the entropy reduction and compression processes are applied to an already compressed input string, which has been compressed with any known compression algorithm.

In yet a fourth exemplary embodiment, a compressed input stream is decompressed with the known decompression algorithm corresponding to the known compression algorithm that was used for compressing the originally input stream. A stream of pseudo random numbers equal to the length of the decompressed stream is produced by a pseudo random number generator, using the same seed used during compression and the binary to decimal bit mapping to produce a new binary sequence. The new binary sequence is then XORed with the decompressed input stream to increase the entropy of the resulting binary stream, and the resulting binary stream is decompressed with the same known decompression algorithm to produce the original input stream.

In yet a further scenario, the entropy increase and compression processes are iteratively applied for decompressing compressed streams that have been iteratively compressed with the current innovative compression methodology.

In a another scenario, the proposed approach is employed for encryption of the compressed data stream or file by exploiting the fact that the length of the string or file, the seed used by the pseudo random number generator, and the type of the pseudo random generator used are unknown to any individual or machine with malicious intents.

The present solution is, in effect a new category of compression/decompression methodologies, which combine compression with encryption for safeguarding data.

DETAILED DESCRIPTION

Figure 1:
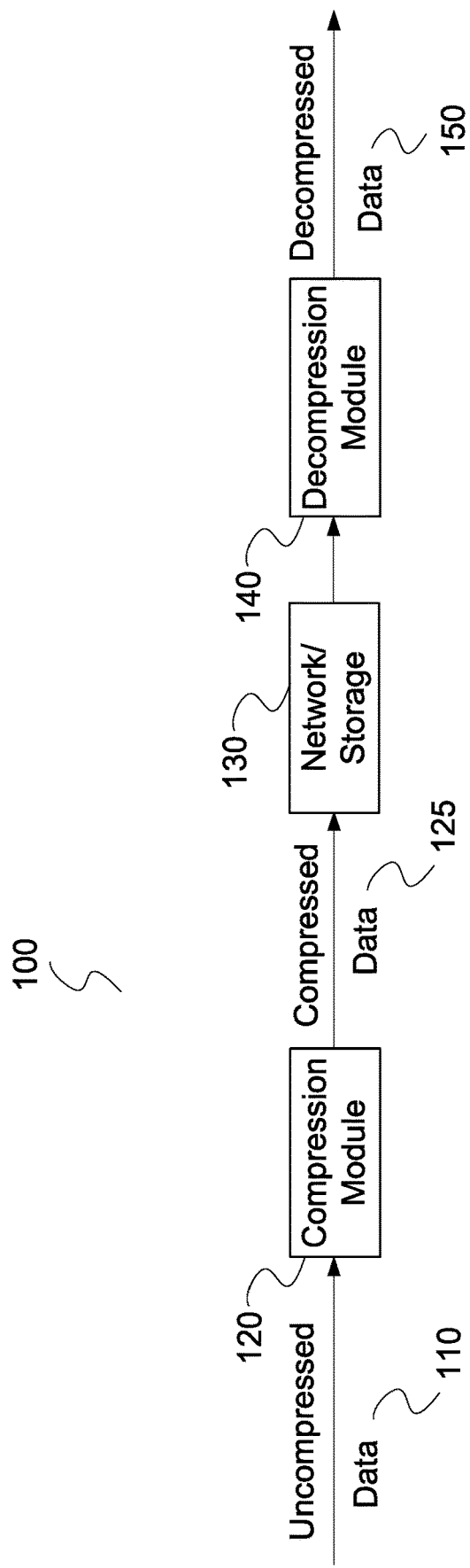
FIG. 1 shows a conventional compression/decompression approach.

The word "exemplary" is used herein to mean "serving as an example, instance, or illustration". Any embodiment described herein as "exemplary" is not necessarily to be construed as preferred or advantageous over other embodiments.

The acronym "APRNG" is intended to mean "Aperiodic Pseudo-Random Number Generator".

The acronym "ASCII" is intended to mean "American Standard Code for Information Interchange".

The acronym "CD" is intended to mean "Compact Disc".

The acronym "DSL" is intended to mean "Digital Subscriber Line".

The acronym "DVD" is intended to mean "Digital Versatile Disc".

The acronym "ERA" is intended to mean "Entropy Reduction Algorithm".

The acronym "PRN" is intended to mean "Pseudo-Random Number".

The acronym "PRNG" is intended to mean "Pseudo-Random Number Generator".

The acronym "RNG" is intended to mean "Random Number Generator".

The acronym "XML" is intended to mean "eXtensible Markup Language".

The term "mobile device" may be used interchangeably with "client device" and "device with wireless capabilities".

The term "user" may be used interchangeably with "regular user", "ordinary user", and "client". It may also be used to mean "user of an application" or "user of a service".

The term "system" may be used interchangeably with "device", "computing device", "apparatus", "computing apparatus", and "service", except where it is obvious to a reader of ordinary skill in related art that these terms refer to different things, as this is apparent by the context of the discussion in which they appear. Under any circumstance, and unless otherwise explicitly stated or implicitly hinted at in the description, these four terms should be considered to have the broadest meaning i.e. that of encompassing all four.

The term "module" may be used interchangeably with "system", "subsystem", "unit" or "subunit", except where it is obvious to a reader of ordinary skill in related art that these terms refer to different things, as this is apparent by the context of the discussion in which they appear.

The term "big" may be used interchangeably with "large", except where it is obvious to a reader of ordinary skill in related art that these terms refer to different things, as this is apparent by the context of the discussion in which they appear.

The term "stream" may be used interchangeably with "data stream", "sequence", "data sequence", "string", "data string", and "file", except where it is obvious to a reader of ordinary skill in related art that these terms refer to different things, as this is apparent by the context of the discussion in which they appear.

The term "file" may be used interchangeably with "data file", except where it is obvious to a reader of ordinary skill in related art that these terms refer to different things, as this is apparent by the context of the discussion in which they appear.

Parameters and names in lower-case and upper-case characters are intended to mean the same thing except where it is obvious to a reader of ordinary skill in related art that these terms refer to different things, as this is apparent by the context of the discussion in which they appear, or where a different meaning is disclosed in the following description.

Technical Characteristics of a Compression/Decompression System in the Prior Art FIG. 1 shows a conventional compression/decompression approach. System 100 is used for the compression and decompression of data. System 100 comprises a compressor module (or subsystem) 120, a decompressor module (or subsystem) 140, and a storage or transmission medium 130.

Uncompressed data 110 are fed to compressor module 120 which applies a compression methodology to produce compressed data 125, which are then stored at storage module 130 and/or transmitted via transmission module 130 to decompression module (or subsystem 140). Decompression module 140 applies a decompression methodology (typically the reverse of the compression methodology used by compression module 120) to produce decompressed data 150. Decompressed data 150 are identical to uncompressed data 110 when a lossless compression methodology is used at compression module 120. If a lossy compression methodology is used at compression module 120, then decompressed data 150 are similar but not identical to uncompressed data 110. The differences between decompressed data 150 and uncompressed data 110 are analogous to the amount of data that are lost during lossy compression.

Figure 2:
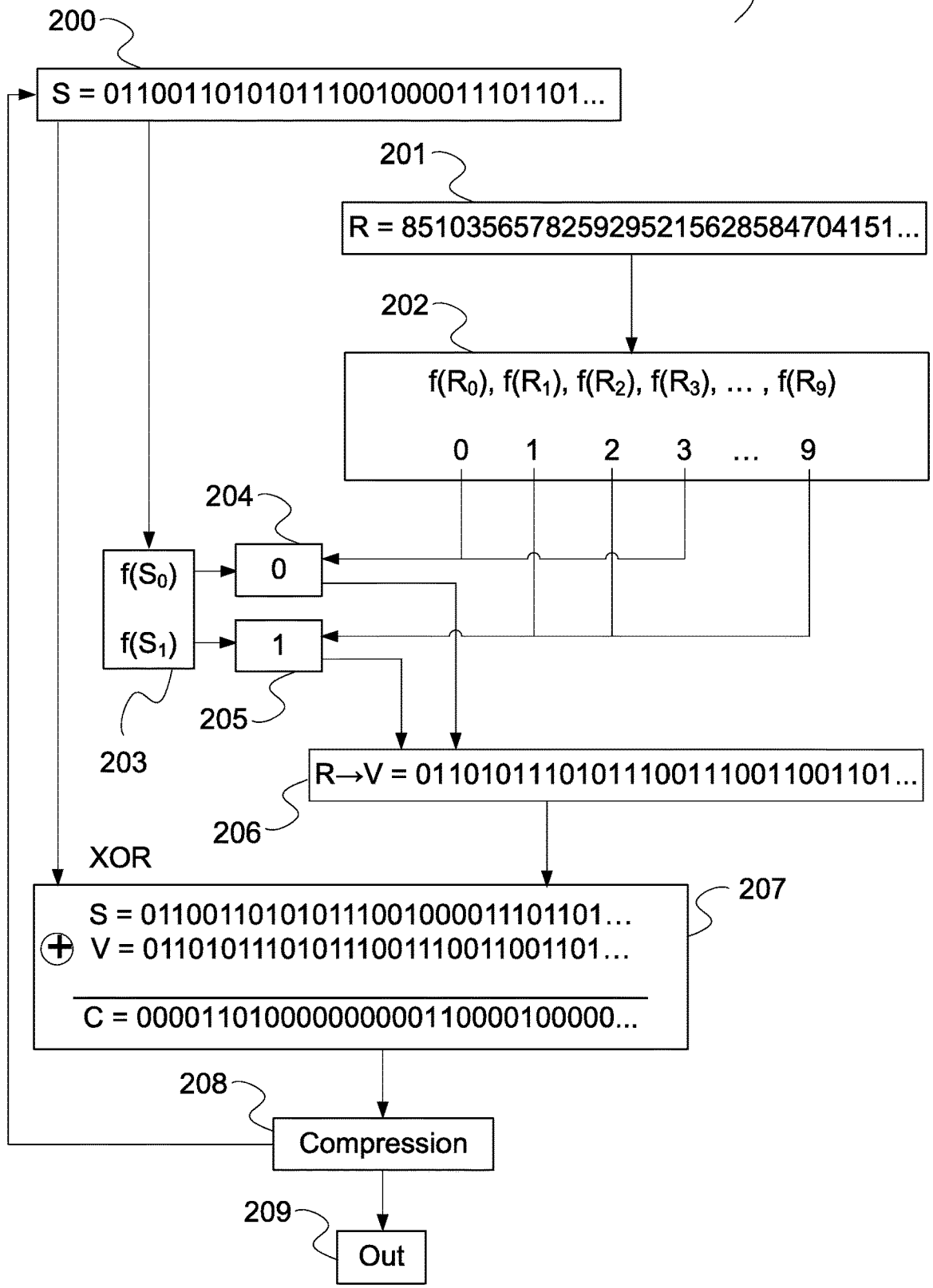
FIG. 2 shows a compression system flowchart in accordance with an exemplary embodiment of the present invention.

Technical Characteristics of the Present Innovative Compression/Decompression System Using Entropy Increase/Reduction and Random Numbers Compression System Using Entropy Reduction Based on Pseudo Random Numbers FIG. 2 shows a compression system flowchart in accordance with an exemplary embodiment of the present invention.

Compression system 250 comprises a memory submodule for uncompressed data 200, a memory submodule for Pseudo Random Number (PRN) data 201, a memory submodule for PRN frequency data 202, a memory submodule for uncompressed data frequency data 203, a memory submodule for a "0" pseudo random number digits 204, a memory submodule for a "1" pseudo random number digit 205, a memory submodule for transformed PRN data 206, a memory submodule for reduced-entropy data 207, a compression module (or subsystem) 208, and a memory submodule for compressed data 209.

Memory submodules 200, 201, 202, 203, 204, 205, 206 207, 209 may be implemented in any known hardware, software, or hybrid (i.e. combination of hardware and software) technology. By means of example the memory submodules may be implemented in RAM, ROM, EEPROM, flash memory, hard disk, optical disk, and the like. They may be implemented in the same hardware memory module (e.g. the same memory chip), in more than one hardware memory modules, in the memory modules residing in a single computing apparatus, in more than one computing apparatuses, in cloud infrastructures, etc. They may be implemented as data arrays holding the entire respective data, in memory arrays each holding a digit or groups of digits of the respective data, in arrays holding tables with the locations (e.g. memory addresses or web addresses, etc.) where each data or data element is stored, etc.

Memory submodule for uncompressed data 200 stores a string S of uncompressed data that is to be compressed by the present system using the innovative compression process. S is in the present exemplary implementation a binary string representing any uncompressed data. S could in an alternative exemplary embodiment be an ASCII character string.

In another aspect of the present exemplary implementation, binary string S is a compressed data string, which has been compressed using a compression algorithm from the prior art (such a compression algorithm from the prior art is different to the present innovative compression algorithm and may be a known algorithm specifically designed to compress a certain data type—e.g. MPEG for video compression).

Memory submodule for uncompressed data frequency data 203 stores the frequencies (of occurrence) of the single binary digits "0" and "1" in S for the even and for the odd positions in S (where S is a compressed data string—i.e. its bits are random—using a compression methodology other that the present innovative compression) i.e.

$f_e(S_0)$=Frequency or # of 0s appearing in even positions in the sequence S.

$f_{od}(S_0)$=Frequency or # of 0s appearing in odd positions in the sequence S.

$f_e(S_1)$=Frequency or # of 1s appearing in even positions in the sequence S.

$f_{od}(S_1)$=Frequency or # of 1s appearing in odd positions in the sequence S.

In alternative exemplary implementations, S is an uncompressed data string in alternative exemplary implementations where the uncompressed stream is made of decimal or other non-binary digits, and the respective frequencies are calculated for each different digit in S, e.g for 0 . . . 9 for decimal data in S).

Memory submodule for PRN data 201 stores a string R, which contains single-digit decimal Pseudo Random Numbers (PRN) (i.e. 0 . . . 9) generated by a Pseudo Random Number Generator (PRNG). The PRNG is a hardware, software or hybrid module that applies a methodology that generates numbers that appear to be random. In reality the PRNG-generated PRNs are not truly random but exhibit a degree of randomness. Since PRNGs generate PRNs that have a certain period one may chose in another exemplary implementation to use an Aperiodic Pseudo Random Number Generator (APRNG) which produces PRNs with a very large period, effectively making the Aperiodic PRNs (APRN) a much better approximation of true random numbers. The choice of PRNG or APRNG module for the production of PRNs is open to the user of the present innovative solution and is not by any means limiting the scope of protection of the present innovative solution. As a result, any PRNG or APRNG known in prior art or any new generator can be used.

Memory submodule for PRN frequency data 202 stores the frequencies (of occurrence) of the single digit decimal PRNs in R for the even and for the odd positions in R, i.e.

$f_e(R_0), f_e(R_1), f_e(R_2), \ldots, f_e(R_9)$=frequencies or # of 0 . . . 9 for the even positions and $f_{od}(R_0), f_{od}(R_1), f_{od}(R_2), \ldots, f_{od}(R_9)$=frequencies or # of 0 . . . 9 for the odd positions where R* are PRNs generated by a PRNG or APRNG. R* may be sequentially produced by the same PRNG or APRNG or by different PRNGs or APRNGs. In one aspect, R* are constructed by the same R', where R' is produced by the same PRNG or APRNG. By means of example, $R_i^*$ are constructed by splitting a large R' into smaller R* or by selecting digits in R' to formulate each R* using some rule or heuristic. In one aspect R* are used sequentially to form R, while in another aspect R* are selectively ordered to generate R.

Then for all the R* used in R, the present innovative solution calculates and selects the frequencies of the decimal (or other in alternative exemplary implementations) digits in the even and odd positions of R, which sum up to the frequencies of the decimal "0" and "1" in the odd and even positions of S:

$f_e(S_0) = f_e(R_i) + f_e(R_{i+1}) + f_e(R_{i+2}) + \ldots$ $f_{od}(S_0) = f_{od}(R_g) + f_{od}(R_{g+1}) + f_{od}(R_{g+2}) + \ldots$ $f_e(S_1) = f_e(R_j) + f_e(R_{j+1}) + f_e(R_{j+2}) + \ldots$ $f_{od}(S_1) = f_{od}(R_u) + f_{od}(R_{u+1}) + f_{od}(R_{u+2}) + \ldots$ In other words, we want the sum of the frequencies $f_e(R_{i+d})$ of some of the pseudo-random numbers x, which appear in the even positions in the sequence R, to be the same with the frequency $f_e(S_0)$ of 0s, which appear in even positions in the sequence S. Then system 250 converts PRNs $R_i, R_{i+1}, R_{i+2}, \ldots$ to "0" 204. In one aspect this operation is implemented by setting the memory locations where PRNs $R_i, R_{i+1}, R_{i+2}, \ldots$ are stored to 0, while in another aspect the memory locations where PRNs $R_i, R_{i+1}, R_{i+2}, \ldots$ are stored are overwritten with the address of a memory location storing "0".

Similarly, the sum of the frequencies $f_{od}(R_{y+e})$ of some of the pseudo-random numbers y, which appear in the odd positions in the sequence R, are selected so that their sum is equal same with the frequency $f_{od}(S_0)$ of 0s which appear in odd positions in the sequence S. Then system 250 converts PRNs $R_y, R_{y+1}, R_{y+2}, \ldots$ to "0" 204. In one aspect this operation is implemented by setting the memory locations where PRNs $R_y, R_{y+1}, R_{y+2}, \ldots$ are stored to "0", while in another aspect the memory locations where PRNs $R_y$, $R_{y+1}$, $R_{y+2}$, . . . are stored are overwritten with the address of a memory location storing "0".

Similarly, the sum of the frequencies $f_e(R_z)$ of some of the pseudo-random numbers z which appear in the even positions in the sequence R, are selected so that their sum is equal same with the frequency $f_e(S_1)$ of 1s which appear in even positions in the sequence S. Then system 250 converts PRNs $R_z$, $R_{z+1}$, $R_{z+2}$, . . . to "1" 205. In one aspect this operation is implemented by setting the memory locations where PRNs $R_z$, $R_{z+1}$, $R_{z+2}$, . . . are stored to "1", while in another aspect the memory locations where PRNs $R_z$, $R_{z+1}$, $R_{z+2}$, . . . are stored are overwritten with the address of a memory location storing "1".

Similarly, the sum of the frequencies $f_{od}(R_q)$ of some of the pseudo-random numbers q which appear in the odd positions in the sequence R, are selected so that their sum is equal same with the frequency: $f_{od}(S_1)$ of is which appear in odd positions in the sequence S. Then system 250 converts PRNs $R_q$, $R_{q+1}$, $R_{q+2}$, . . . to "1" 205. In one aspect this operation is implemented by setting the memory locations where PRNs $R_q$, $R_{q+1}$, $R_{q+2}$, . . . are stored to "1", while in another aspect the memory locations where PRNs $R_q$, $R_{q+1}$, $R_{q+2}$, . . . are stored are overwritten with the address of a memory location storing "1".

In the above frequency selections and summations:
(x)=# of the pseudo-random numbers which appear in the same number of even positions (in the sequence R) with the 0s (in the sequence S).
(y)=# of the pseudo-random numbers which appear in the same number of odd positions (in the sequence R) with the 0s (in the sequence S).
(z)=# of the pseudo-random numbers which appear in the same number of even positions (in the sequence R) with the 1s (in the sequence S).
(q)=# of the pseudo-random numbers which appear in the same number of even positions (in the sequence R) with the 1s (in the sequence S).

In one aspect the summation of frequencies $f_e(R^*)$ and $f_{od}(R^*)$ for matching $f_e(S^*)$ and $f_{od}(S^*)$, respectively, may not lead to a perfect match. In such a situation the best approximations to $f_e(S^*)$ and $f_{od}(S^*)$, respectively, are selected. These differences (i.e. approximations) do not result in lossy compression as they are "balanced" (i.e. cancelled) out by the very large length of the PRN string R.

The previous conversions of PRNs positions to "0" and "1" are ordered to create a new transformed PRN data string V, which is stored in memory submodule for transformed PRN data 206, i.e. the mapping between string R to string V.

String V 206 has very similar binary distribution to the binary distribution of string S 200. System 250 continues by performing an XoR operation 207, 301 to the two binary streams, S and V, which operation produces binary string C stored in memory submodule for reduced-entropy data 207, 301 which now has less Entropy (i.e. contains more repeating data). Next, system 250 applies any Compression Algorithm 208, 302 to compress string C to string S' (length κ', with κ'<κ). Compression Algorithm 208, 302 is selected among compression algorithms known in prior art or among proprietary compression algorithms.

The final, output file 209, 303 is padded to contain:
the compressed sequence: S'<S
the seed number h used by the PRNG: 30 bits<=length (h)<=300 bits, and
the mapping 206 between the decimal and binary numbers: (mapping $b_{binary}$–$b_{decimal}$)=(mapping $b_2$–$b_{10}$)=20 bits, 10 bits for the even positions and 10 bits for the odd positions
with:

$$\text{length}(S')+\text{length}(h)+\text{length}(\text{mapping } b_2-b_{10}) \lll S$$

and is stored in memory submodule for compressed data 209.

In another exemplary implementation, system 250 repeats the above entropy reduction and compression processes until a desirable compression is achieved or convergence to a compression limit is reached.

In one aspect the compression steps described above for system 250 are performed by a single compression module 208, while in other aspects the above steps are performed by more than one module (these additional optional modules implement each of the above corresponding steps, or groups of the above steps, and are nor shown in FIG. 2 as they are obvious to any person of ordinary skill in related art).

Figure 3:
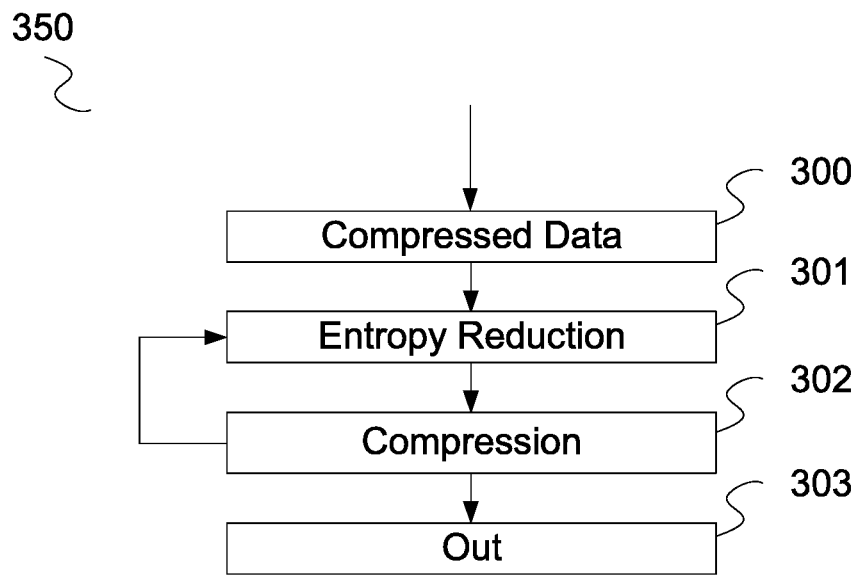
FIG. 3 shows an iterative compression example flowchart in accordance with an exemplary embodiment.

Iterative Application of the Compression and Entropy Reduction Based on Pseudo Random Numbers FIG. 3 shows an iterative compression example flowchart in accordance with an exemplary embodiment. Iterative compression flowchart 350 starts with compressed data 300 (e.g. produced by a compression algorithm from the prior art other than the present innovative solution) being used to reduce its entropy 301 and compress it 302 according to the system 250. Following the production of a compression result, at step 302, the process of flowchart 350 branches back to the entropy reduction step 301 and then the compression step 302 is executed. The branching back and the execution of steps 301, 302 are repeated until a desirable compression level is reached or until the compression after each iteration converges to a compression limit where further iterations produce no practical decrease in the size of the compressed stream, which is then outputted 303 for storage or transmission.

Iterative Decompression and Entropy Increase Based on Pseudo Random Numbers

Figure 4:
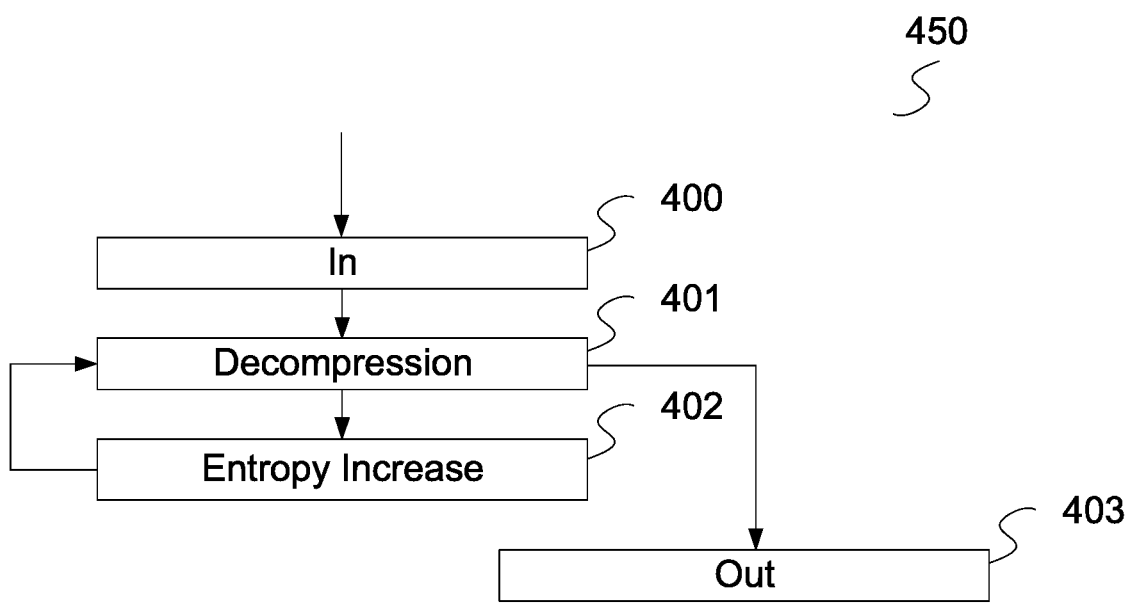
FIG. 4 shows an iterative decompression example flowchart in accordance with an exemplary embodiment.

Decompression is the reverse process of compression 250, 350. FIG. 4 shows an iterative decompression example flowchart in accordance with an exemplary embodiment. Decompression system 450, gets compressed stream (or file) 400 as input to decompressor module 401, which decompresses the compressed stream (or file) S' into stream (or file) C with length L>length(S'). Decompression system 450 increases the Entropy 402 and returns the sequence to the previous bit distribution, of sequence S. Decompression system 450 then commands decompression module 401 to decompress the sequence S, repeats the entropy increase 402 and decompression 501 steps as many iterations as the compression and entropy decrease steps were iterated during compression, and output the original file 403 without loss of data.

Decompression System Using Entropy Increase Based on Pseudo Random Numbers

Figure 5:
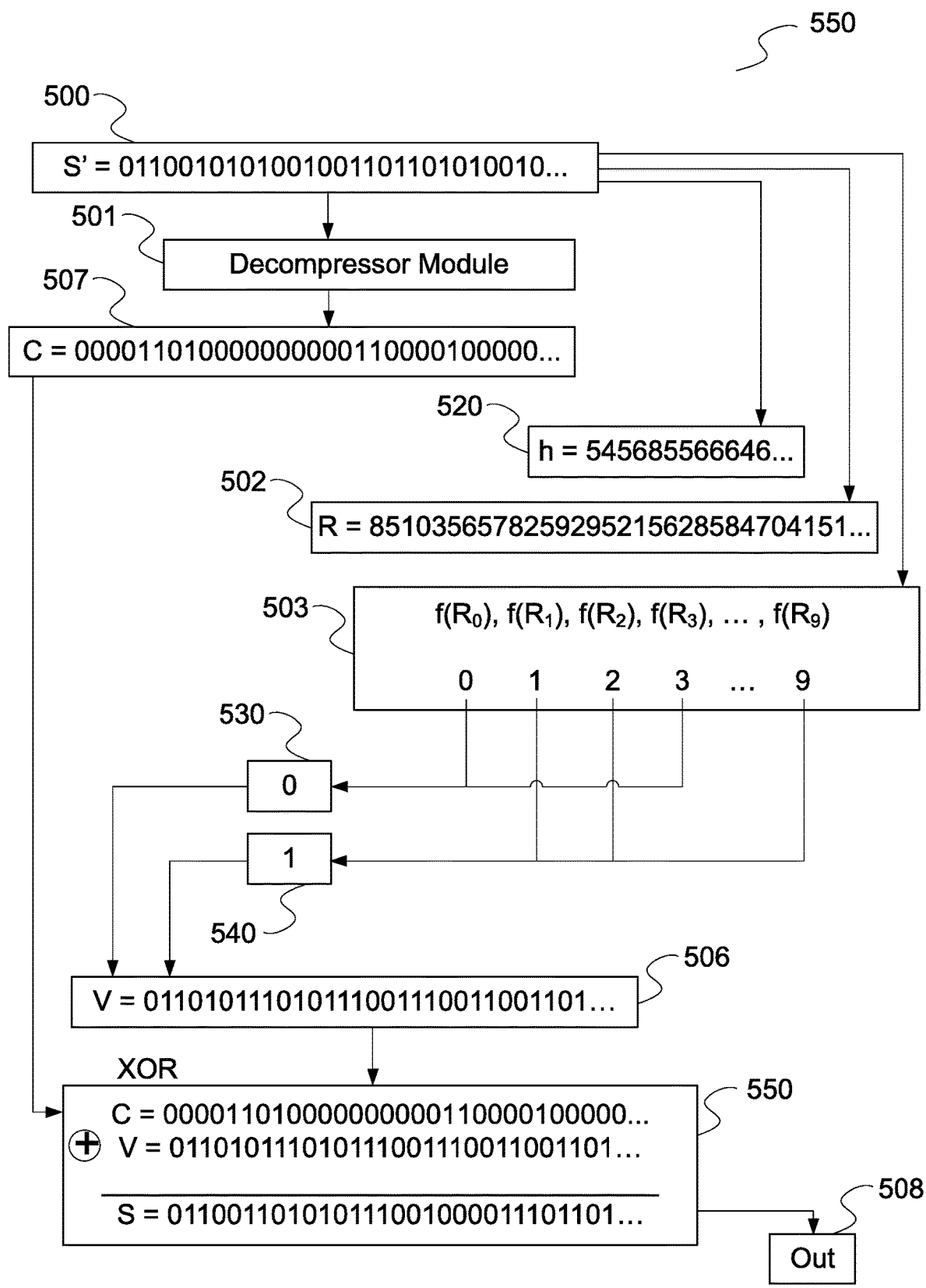
FIG. 5 shows a decompression system flowchart in accordance with an exemplary embodiment.

FIG. 5 shows a decompression system flowchart in accordance with an exemplary embodiment. Decompression system 550, gets compressed stream (or file) 500 as input to decompressor module 501, which decompresses the compressed stream (or file) S' into stream (or file) C 507 with length L>length(S'). Then decompression system 550 uses a PRNG or APRNG to produce L pseudo-random one-digit numbers 502 (i.e. pseudo random number string R) from the seed number h 520 (also contained in the compressed data string/file S' 500) and through the mapping string (i.e.

mapping b2-b10) 503 to "0" 530 and "1" 540. Decompression system 550 converts the L pseudo-random one-digit numbers (i.e. R stream) 502 to binary pseudo-random numbers, producing a new binary sequence V 506, and performs an XoR operation 550 between the binary sequences C 507 and V 506, producing the sequence S 508. In this way decompression system 550 increases the Entropy 402 and returns the sequence to the previous bit distribution, of sequence S 508. Decompression system 550 then commands decompression module 501 to decompress the sequence S 508 and output the original file 510 without loss of data.

The present innovative compression decompression methodology and systems are based on an Entropy Reduction Algorithm (ERA), the implementation of which has been presented above.

Besides its used for compression and decompression, ERA can also be used for encryption and decryption purposes (e.g. file encryption, streaming voice/video encryption etc.). ERA offers strong encryption performance and is very hard to "break" since a cryptanalyst or interceptor does not know neither the a priori original length of the compressed file, nor the mapping between the decimal and binary numbers, nor the seed of the PRNG, or the type of the PRNG that is used to transform the bit Stream or the file S.

ERA can be made more secure for encryption/decryption use by selecting an APRNG producing very large length PRNs with a very large period approximating true PRNs, and a very large seed.

Implementation of the ERA Compression System

Figure 6:
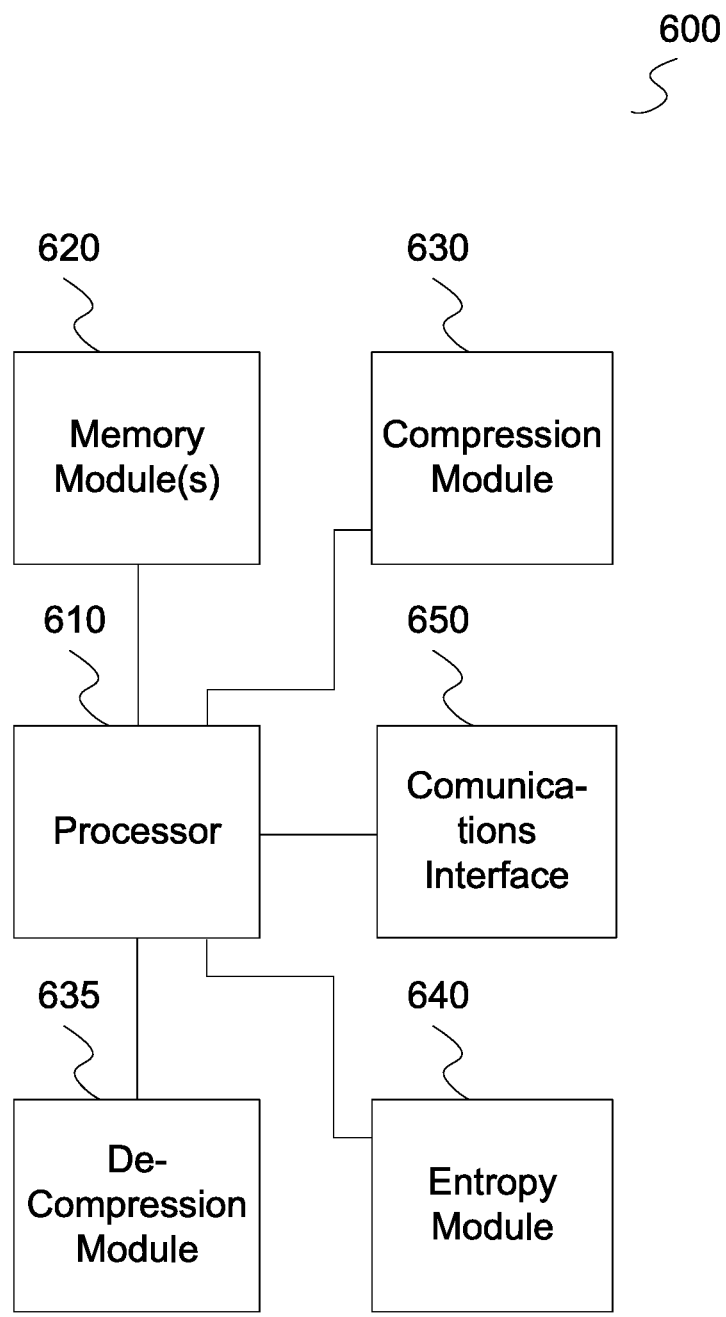
FIG. 6 shows an example implementation of a Compression/Decompression System according to the present innovative ERA algorithm.

FIG. 6 shows an example implementation of a Compression/Decompression System according to the present innovative ERA algorithm. System 600 comprises a processor 610, which is connected to at least one memory module 620, to a compression module 630, a decompression module 635, an entropy module 640 and optionally to a communications interface 650. Other modules may exist in system 600, like user interface module, hard disk module, display module, etc., which are not shown in FIG. 6 as they are obvious to any person of ordinary skill in related art, and which do not alter the scope of the present innovative system and methodology.

Processor 610 is in charge of the compression/decompression and entropy reduction/increase operations. During compression operation, processor 610 commands entropy module 640 to decrease the entropy of the compressed input stream (or file), and compression module 630 to compress the decreased-entropy stream (or file).

In an alternative exemplary embodiment, processor 610 iteratively commands entropy module 640 and compression module 630 to perform their respective tasks for the overall target of iterative compression of the compressed bit stream (or file) until a desired compression ratio is achieved or until compression converges to a compression limit.

During decompression operation, processor 635 fed with the compressed data stream and decompressing it, then the processor 610 commands entropy module 640 to increase the entropy of the decompressed stream (or file), and decompression module 635 to decompress the increased-entropy stream (or file).

In an alternative exemplary embodiment, processor 610 iteratively commands entropy module 640 and decompression module 635 to perform their respective tasks for the overall target of iterative decompression of the compressed bit stream (or file) until the original bit stream (or file) has been recovered without loss of data.

All modules of system 600 are implemented in hardware, software or a combination thereof. Hardware implementation is done either with general-purpose programmable chips and/or Integrated Circuit (IC) boards which are essentially transformed into application specific hardware components implementing the above tasks, or as Application Specific Integrated Circuits (ASIC). Regardless of the hardware design architecture and choice of hardware component types, any hardware technology known to a user of ordinary skill in related art may be used to implement the flowcharts of FIG. 2-5.

System 600 main in one aspect be implemented as a computing apparatus.

Software implementation is done using any programming language known in prior art, including but not limited to object-oriented programming languages, assembly code, machine code, descriptive languages (e.g. XML-type languages), visual programming languages etc.

Hybrid implementation uses any of the above hardware and software in synergetic use and includes other architectures like mobile computing, client-server architectures, cloud, etc.

The above exemplary implementations of the present innovative solution are not to be deemed as falling into the category of not patentable subject matter, and in particular they do not constitute automation or mere computer implementations of mental processes and non-patentable subject matter. The reason for not being directed to mental processes and non-patentable subject matter stems from the fact that the above exemplary implementations use a set of methodologies, hardware and software implementations that combine and transform individual known concepts, circuits, and software for general-purpose solutions to specific solutions for RPC compression/decompression and encryption/decryption with faster operation than prior art, reduced processing requirements, and significantly longer periods in the created pseudo-random number generators. As a result, the known concepts, circuits, and software are repurposed to operate in a novel and distinct way that solve a very specific and previously unsolved problem, thus rendering them innovative and unanticipated to persons of ordinary skill in related art.

The examples used above to describe the present innovative solution should not be viewed as limiting the scope of the present innovative solution. The present innovative solution may be applied to scenarios of use and settings other than those described in the presented examples.

The above exemplary are intended for use either as a standalone system or method in any conceivable scientific and business domain, or as part of other scientific and business methods, processes and systems.

The above exemplary embodiment descriptions are simplified and do not include hardware and software elements that are used in the embodiments but are not part of the current invention, are not needed for the understanding of the embodiments, and are obvious to any user of ordinary skill in related art. Furthermore, variations of the described method, system architecture, and software architecture are possible, where, for instance, method steps, and hardware and software elements may be rearranged, omitted, replaced with equivalent, or new added.

Various embodiments of the invention are described above in the Detailed Description. While these descriptions directly describe the above embodiments, it is understood that those skilled in the art may conceive modifications and/or variations to the specific embodiments shown and described herein unless specifically excluded. Any such modifications or variations that fall within the purview of this description are intended to be included therein as well. Unless specifically noted, it is the intention of the inventor that the words and phrases in the specification and claims be given the ordinary and accustomed meanings to those of ordinary skill in the applicable art(s).

The foregoing description of a preferred embodiment and best mode of the invention known to the applicant at this time of filing the application has been presented and is intended for the purposes of illustration and description. It is not intended to be exhaustive or limit the invention to the precise form disclosed and many modifications and variations are possible in the light of the above teachings. The embodiment was chosen and described in order to best explain the principles of the invention and its practical application and to enable others skilled in the art to best utilize the invention in various embodiments and with various modifications as are suited to the particular use contemplated. Therefore, it is intended that the invention not be limited to the particular embodiments disclosed for carrying out this invention, but that the invention will include all embodiments falling within the scope of the appended claims.

In one or more exemplary embodiments, the functions described may be implemented in hardware, software, firmware, or any combination thereof. If implemented in software, the functions may be stored on or transmitted over as one or more instructions or code on a computer readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or any other device or apparatus operating as a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A computer implemented method of compressing a data stream, comprising:
generating, using a pseudo random number generator, a stream of single-digit decimal pseudo random numbers;
reducing entropy of a first binary data stream, using an entropy reduction module, using the stream of single-digit decimal pseudo random numbers to produce a second binary data stream; and
compressing, using a compression module, the second binary data stream to generate a third binary data stream.

2. The computer implemented method of claim 1, further comprising iteratively performing the reducing and compressing steps until one of (a) a pre-determined compression level is reached, and (b) a compression level converges to a conversion limit.

3. The computer implemented method of claim 2, wherein the entropy reduction module further performs the steps of:
receiving the first binary data stream;
calculating the frequency of occurrence of binary digit "0" in the even positions, binary digit "0" in the odd positions, binary digit "1" in the even positions, and binary digit "1" in the odd positions of the first binary data stream;
calculating the frequency of occurrence of decimal digits (0 . . . 9) in the even positions, and the frequency of occurrence of decimal digits (0 . . . 9) in the odd positions of the stream of single-digit decimal pseudo random numbers;
selecting a first subset of the frequencies of occurrence of the decimal digits (0 . . . 9) in the even positions of the stream of single-digit decimal pseudo random numbers, where the sum of the first subset of the frequencies of occurrence of the decimal digits (0 . . . 9) in the even positions of the stream of single-digit decimal pseudo random numbers best approximates the frequency of occurrence of the binary digit "0" in the even positions of the first binary data stream;
setting the decimal digits (0 . . . 9) in the even positions of the stream of single-digit decimal pseudo random numbers, corresponding to the first subset of the frequencies of occurrence, equal to "0";
selecting a second subset of the frequencies of occurrence of the decimal digits (0 . . . 9) in the odd positions of the stream of single-digit decimal pseudo random numbers, where the sum of the second subset of the frequencies of occurrence of the decimal digits (0 . . . 9) in the odd positions of the stream of single-digit decimal pseudo random numbers best approximates the frequency of occurrence of the binary digit "0" in the odd positions of the first binary data stream;
setting the decimal digits (0 . . . 9) in the odd positions of the stream of single-digit decimal pseudo random numbers, corresponding to the second subset of the frequencies of occurrence, equal to "0";
selecting a third subset of the frequencies of occurrence of the decimal digits (0 . . . 9) in the even positions of the stream of single-digit decimal pseudo random numbers, where the sum of the third subset of the frequencies of occurrence of the decimal digits (0 . . . 9) in the even positions of the stream of single-digit decimal pseudo random numbers best approximates the frequency of occurrence of the binary digit "1" in the even positions of the first binary data stream;
setting the decimal digits (0 . . . 9) in the even positions of the stream of single-digit decimal pseudo random numbers, corresponding to the third subset of the frequencies of occurrence, equal to "1";
selecting a fourth subset of the frequencies of occurrence of the decimal digits (0 . . . 9) in the odd positions of the stream of single-digit decimal pseudo random numbers, where the sum of the fourth subset of the frequencies of occurrence of the decimal digits (0 . . . 9) in the odd positions of the stream of single-digit decimal pseudo random numbers best approximates the frequency of occurrence of the binary digit "1" in the odd positions of the first binary data stream;

setting the decimal digits (0 . . . 9) in the odd positions of the stream of single-digit decimal pseudo random numbers, corresponding to the fourth subset of the frequencies of occurrence, equal to "1";

ordering the first, second, third, and fourth subsets of the frequencies of occurrence of the decimal digits (0 . . . 9) in the stream of single-digit decimal pseudo random numbers to create a fourth binary stream; and performing an XOR operation to the first and fourth binary data streams for producing the second binary data stream.

4. The computer implemented method of claim 3, where at least one of the following is true:

the first, second, third, and fourth binary data streams are data files;

the first binary data stream is a compressed data file;

the pseudo random number generator uses a seed number to produce the stream of single-digit decimal pseudo random numbers; and the third binary data stream comprises the second binary data stream, the seed number, and the fourth data stream.

5. The computer implemented method of claim 4, where the third binary data stream is an encrypted version of the first binary data stream.

6. A computer implemented method of decompressing a data stream, comprising:

decompressing, using a decompression module, a first binary data stream into a second binary data stream;

producing, using a pseudo random number generator, a stream of single-digit decimal pseudo random numbers, and using a seed number extracted from the first binary data stream; and increasing, using an entropy increase module, entropy of the second binary data stream using the stream of single-digit decimal pseudo random numbers to produce a third binary data stream.

7. The computer implemented method of claim 6, further comprising iteratively performing the increasing of entropy and the decompressing steps for as many iterations as compression and entropy decrease steps were iterated during a compression process for producing the first binary data stream.

8. The computer implemented method of claim 7, wherein the entropy increase module further performs the steps of:

receiving the second binary data stream;

using a fourth binary data stream, extracted from the first binary data stream, to produce a fifth binary data stream from the stream of single-digit decimal pseudo random numbers by selectively setting digits of the stream of single-digit decimal pseudo random numbers to "0" or "1"; and performing an XOR operation to the second and fifth binary data streams for producing the third binary data stream.

9. The computer implemented method of claim 8, where at least one of the following is true:

the first, second, third, fourth, and fifth binary data streams are data files; and the third binary data stream is a compressed data file.

10. A non-transitory computer readable medium for compressing a data stream, the non-transitory computer readable medium comprising instructions to cause a computing apparatus to:

command a pseudo random number generator to produce a stream of single-digit decimal pseudo random numbers;

command an entropy reduction module to reduce entropy of a first binary data stream using the stream of single-digit decimal pseudo random numbers, and produce a second binary data stream; and command a compression module to compress the second binary data stream into a third binary data stream and output the third binary data stream.

11. The non-transitory computer readable medium of claim 10, further comprising instructions to iteratively command the entropy reduction module to reduce entropy and the compression module to compress binary data streams until one of (a) a pre-determined compression level is reached, and (b) a compression level converges to a conversion limit.

12. The non-transitory computer readable medium of claim 11, further comprising instructions for the entropy reduction module to:

receive the first binary data stream;

calculate the frequency of occurrence of binary digit "0" in the even positions, binary digit "0" in the odd positions, binary digit "1" in the even positions, and binary digit "1" in the odd positions of the first binary data stream;

calculate the frequency of occurrence of decimal digits (0 . . . 9) in the even positions, and the frequency of occurrence of decimal digits (0 . . . 9) in the odd positions of the stream of single-digit decimal pseudo random numbers;

select a first subset of the frequencies of occurrence of the decimal digits (0 . . . 9) in the even positions of the stream of single-digit decimal pseudo random numbers, where the sum of the first subset of the frequencies of occurrence of the decimal digits (0 . . . 9) in the even positions of the stream of single-digit decimal pseudo random numbers best approximates the frequency of occurrence of the binary digit "0" in the even positions of the first binary data stream;

set the decimal digits (0 . . . 9) in the even positions of the stream of single-digit decimal pseudo random numbers, corresponding to the first subset of the frequencies of occurrence, equal to "0";

select a second subset of the frequencies of occurrence of the decimal digits (0 . . . 9) in the odd positions of the stream of single-digit decimal pseudo random numbers, where the sum of the second subset of the frequencies of occurrence of the decimal digits (0 . . . 9) in the odd positions of the stream of single-digit decimal pseudo random numbers best approximates the frequency of occurrence of the binary digit "0" in the odd positions of the first binary data stream;

set the decimal digits (0 . . . 9) in the odd positions of the stream of single-digit decimal pseudo random numbers, corresponding to the second subset of the frequencies of occurrence, equal to "0";

select a third subset of the frequencies of occurrence of the decimal digits (0 . . . 9) in the even positions of the stream of single-digit decimal pseudo random numbers, where the sum of the third subset of the frequencies of occurrence of the decimal digits (0 . . . 9) in the even positions of the stream of single-digit decimal pseudo random numbers best approximates the frequency of occurrence of the binary digit "1" in the even positions of the first binary data stream;

set the decimal digits (0 . . . 9) in the even positions of the stream of single-digit decimal pseudo random numbers, corresponding to the third subset of the frequencies of occurrence, equal to "1";

select a fourth subset of the frequencies of occurrence of the decimal digits (0 . . . 9) in the odd positions of the stream of single-digit decimal pseudo random numbers, where the sum of the fourth subset of the frequencies of occurrence of the decimal digits (0 . . . 9) in the odd positions of the stream of single-digit decimal pseudo random numbers best approximates the frequency of occurrence of the binary digit "1" in the odd positions of the first binary data stream;

set the decimal digits (0 . . . 9) in the odd positions of the stream of single-digit decimal pseudo random numbers, corresponding to the fourth subset of the frequencies of occurrence, equal to "1";

order the first, second, third, and fourth subsets of the frequencies of occurrence of the decimal digits (0 . . . 9) in the stream of single-digit decimal pseudo random numbers to create a fourth binary stream; and perform an XOR operation to the first and fourth binary data streams for producing the second binary data stream.

13. The non-transitory computer readable medium of claim 12, where at least one of the following is true:

the first, second, third, and fourth binary data streams are data files;

the first binary data stream is a compressed data file;

the pseudo random number generator uses a seed number to produce the stream of single-digit decimal pseudo random numbers; and the third binary data stream comprises the second binary data stream, the seed number, and the fourth data stream.

14. The non-transitory computer readable medium of claim 13, where third binary data stream is an encrypted version of the first binary data stream.

15. A non-transitory computer readable medium for decompressing a data stream, the non-transitory computer readable medium comprising instructions to cause a computing apparatus to:

command a decompression module to decompress a first binary data stream into a second binary data stream;

command a pseudo random number generator to produce a stream of single-digit decimal pseudo random numbers using a seed number extracted from the first binary data stream; and command an entropy increase module to increase entropy of the second binary data stream, using the stream of single-digit decimal pseudo random numbers, and produce and output a third binary data stream.

16. The non-transitory computer readable medium of claim 15, further comprising instructions to iteratively command the entropy increase module to increase entropy and the decompression module to decompress binary data streams for as many iterations as compression and entropy decrease steps were iterated during a compression process for producing the first binary data stream.

17. The non-transitory computer readable medium of claim 16, further comprising instructions to cause the entropy increase module to:

receive the second binary data stream;

use a fourth binary data stream, extracted from the first binary data stream, to produce a fifth binary data stream from the stream of single-digit decimal pseudo random numbers by selectively setting digits of the stream of single-digit decimal pseudo random numbers to "0" or "1"; and perform an XOR operation to the second and fifth binary data streams for producing the third binary data stream.

18. The non-transitory computer readable medium of claim 17, where at least one of the following is true:

the first, second, third, fourth, and fifth binary data streams are data files; and the third binary data stream is a compressed data file.

* * * * *